(12) United States Patent
Richardson

(10) Patent No.: US 9,344,063 B2
(45) Date of Patent: May 17, 2016

(54) DRIVE CIRCUIT FOR A GATED SEMICONDUCTOR SWITCHING DEVICE AND METHOD FOR DRIVING A GATED SEMICONDUCTOR SWITCHING DEVICE

(75) Inventor: Robert Richardson, Chelmsford (GB)

(73) Assignee: E2V TECHNOLOGIES (UK) LIMITED, Chelmsford (GB)

(*) Notice: Subject to any disclaimer, the term of this patent is extended or adjusted under 35 U.S.C. 154(b) by 0 days.

(21) Appl. No.: 14/238,697

(22) PCT Filed: Aug. 10, 2012

(86) PCT No.: PCT/GB2012/051948
§ 371 (c)(1),
(2), (4) Date: Mar. 21, 2014

(87) PCT Pub. No.: WO2013/024270
PCT Pub. Date: Feb. 21, 2013

(65) Prior Publication Data
US 2014/0203849 A1 Jul. 24, 2014

(30) Foreign Application Priority Data

Aug. 12, 2011 (GB) .................................. 1113908.6

(51) Int. Cl.
*H03K 3/00* (2006.01)
*H03K 3/012* (2006.01)
(Continued)

(52) U.S. Cl.
CPC ............ *H03K 3/012* (2013.01); *H03K 17/0424* (2013.01); *H03K 17/166* (2013.01)

(58) Field of Classification Search
CPC ... H03K 17/691; H03K 17/723; H03K 3/012; H03K 17/0424; H03K 17/166

USPC .......................................... 327/108, 372, 376
See application file for complete search history.

(56) References Cited

U.S. PATENT DOCUMENTS

| | | | |
|---|---|---|---|
| 2,774,888 A | | 12/1956 | Trousdale |
| 3,930,170 A | * | 12/1975 | Burens et al. ................. 327/487 |
| 3,983,418 A | | 9/1976 | Wallace |

(Continued)

FOREIGN PATENT DOCUMENTS

| | | |
|---|---|---|
| DE | 28 24 957 A1 | 1/1980 |
| EP | 0 687 056 A2 | 12/1995 |

(Continued)

OTHER PUBLICATIONS

Tang, T and Burkhart, C. "Hybrid MOSFET/Driver for Ultra-fast Switching", IEEE Transctions on Dielectrics and Electrical Insulation, vol. 16, No. 4; Aug. 2009 pp. 967-970.

(Continued)

*Primary Examiner* — Kenneth B Wells
(74) *Attorney, Agent, or Firm* — FisherBroyles, LLP; Robert Kinberg

(57) ABSTRACT

Drive circuit and method for a gated semiconductor switching device A drive circuit and method for a gated semiconductor switching device (10) comprising providing coupling such as a mutual inductance between a gate drive circuit (21) for the device and a drain to source current supply circuit (22) for the device in order to change a gate voltage provided by the gate drive circuit dependent on a rate of change of a current in the drain to source current supply circuit. The change in gate voltage has a magnitude and phase arranged to increase or decrease a switching speed of the gated semiconductor switching device.

18 Claims, 4 Drawing Sheets

(51) Int. Cl.
*H03K 17/0424* (2006.01)
*H03K 17/16* (2006.01)

(56) References Cited

U.S. PATENT DOCUMENTS

| | | | | |
|---|---|---|---|---|
| 3,999,086 A | * | 12/1976 | Ekelund | 327/109 |
| 4,481,431 A | * | 11/1984 | Nishino et al. | 327/579 |
| 4,873,757 A | * | 10/1989 | Williams | 29/602.1 |
| 4,914,558 A | | 4/1990 | Flickinger | |
| 5,332,938 A | | 7/1994 | McEwan | |
| 5,461,353 A | * | 10/1995 | Eberhardt | 333/246 |
| 5,565,837 A | * | 10/1996 | Godek et al. | 336/232 |
| 6,211,738 B1 | * | 4/2001 | Hecht | 330/292 |
| 6,593,201 B2 | * | 7/2003 | Forbes | 438/381 |
| 7,221,251 B2 | * | 5/2007 | Menegoli et al. | 336/200 |
| 2005/0194919 A1 | | 9/2005 | Xavier et al. | |
| 2007/0268649 A1 | * | 11/2007 | Wang | 361/160 |

FOREIGN PATENT DOCUMENTS

| | | |
|---|---|---|
| GB | 2 132 436 A | 7/1984 |
| JP | 60-086912 A | 5/1985 |
| WO | WO 2005-025065 A1 | 3/2005 |
| WO | WO 2007-137268 A2 | 11/2007 |

OTHER PUBLICATIONS

IXYS DE475-102N21A RF Power MOSFET.
International Search Report for PCT/GB2012/051948 dated Nov. 22, 2012.
International Rectifier Application Note AN-937; "Gate Drive Characteristics and Requirements for HEXFET® Power MOSFETs".

* cited by examiner

DRIVE CIRCUIT FOR A GATED SEMICONDUCTOR SWITCHING DEVICE AND METHOD FOR DRIVING A GATED SEMICONDUCTOR SWITCHING DEVICE

This invention relates to a drive circuit and method for a gated semiconductor switching device and in particular for a MOSFET.

BACKGROUND

Problems which have to be overcome in fast MOSFET switching are discussed in "Gate Drive Characteristics and Requirements for HEXFET™ Power MOSFETs" International Rectifier Application Note AN-937, available from International Rectifier, 101 N Sepulveda Blvd., El Segundo, Calif. 90245, USA, which covers key requirements for driving MOSFETs.

An equivalent circuit of a practical MOSFET 10 is shown in FIG. 1. A package 20 for the MOSFET comprises a source with an internal source connection S, a drain with an internal drain connection D and a gate with an internal gate connection G and with a corresponding respective external source package terminal St, external drain package terminal Dt and external gate package terminal Gt. Under most conditions when driving MOSFETs three stray capacitances between the internal connections, a gate-source capacitance Cg_s, a drain-source capacitance Cd_s, and a gate-drain capacitance Cg_d, determine an ultimate switching speed of the MOSFET, for a given drive circuit and design.

However, MOSFETs are produced in a number of different styles of package 20 of which TO220 and TO247 are known examples. These packages require lead-outs to be taken from the MOSFET die 10 to the respective external package terminals St, Dt and Gt of the package 20. These lead-outs, however short they may be, produce a gate inductance Lg between the internal gate connection G and the external gate package terminal Gt, a drain inductance Ld between the internal drain connection D and the external drain package terminal Dt, and a source inductance Ls between the internal source connection S and the external source package terminal St which further affect the achievable switching speed. A gate resistance Rg also exists in series with the gate inductance between the internal gate connection G and the external gate terminal Gt. Connecting the device into a circuit may increase the effective magnitude of these inductances.

For the following reasons, the most significant of these stray inductances is the source inductance Ls. FIG. 2 shows a typical simple prior art circuit in which a gate drive circuit 21 is connected between the external source package terminal St and external gate package terminal Gt and a DC supply 22 is connected between the external source package terminal St and the external drain package terminal Dt. An external inductance Lext is present between the DC supply 22 and gate drive circuit 21 and the external source package terminal St. A drive resistance Rdrive is present between the gate drive circuit 21 and the external gate package terminal Gt. A load inductance Lload and load resistance Rload may be connected in series between the DC supply 22 and the external drain package terminal Dt.

During turn on, when a current Ids in the channel between the source and drain begins to rise, a voltage Vsource is induced across the source inductance Ls and the external inductance Lext between the external source packge terminal St and the gate drive circuit 21, where Vsource=(Ls+Lext)*d (Ids)/dt). This voltage opposes an effect of a voltage Vdrive from the gate drive circuit 21 and slows a switching speed of the MOSFET. Conversely, during turning off of the MOSFET, the Vsource voltage slows the turn off process. That is, whenever the source-drain current Ids is changing, a voltage is induced across the source inductance Ls and external inductance Lext that reduces the effectiveness of a drive voltage Vdrive applied to the external gate terminal. Moreover, power is predominantly dissipated from the MOSFET while the source to drain current is changing, so for this reason at least it is usually desirable to decrease the switching time.

Several manufacturers have produced packages that reduce the inductance Ls to very low values or provide separate terminals for a gate drive return to the source inductance Ls. An example of such a device is the IXYS DE475-102N21A, which incorporates both these features and is available from IXYS RF, 2401 Research Boulevard, Suite 108, Fort Collins, Colo., USA.

Other attempts have been made to increase switching speed in MOSFETs. For example, in "Hybrid MOSFET/driver for ultrafast switching" T. Tang and C. Burkhart Stamford Linear Accelerator Center Publication 13269, June 2008 (also published in Proc. IEEE International Power Modulators and High Voltage Conference, 27-31 May 2008, pp 128-130 and in IEEE Trans. on Dielectrics and Electrical Insulation 16(4), August 2009, pp 967-970) very high voltages of up to 30 V are used for the drive voltage Vdrive, switching between high positive voltages of +30V for turn on to large negative voltages of −30V for turn off. This is effective in increasing switching speed but is very stressful on the MOSFETs since it pushes the gate-source voltage to its very limit, usually only ±20V, and this can affect device life. Many drive circuit components are also required for implementation.

U.S. Pat. No. 5,332,938 proposes compensating for source lead inductance by adding a compensating inductor in parallel to the gate lead to supply an inductive voltage spike to the gate lead to form a more rectangular drive voltage waveform. However, this solution requires a gate drive current source and the insertion of a source resistance. For very high speed applications a physical size of the source resistance will add further inductance and provide a basic current limit to the final current as well.

WO 2007/137268 discloses a method of using a higher voltage to initiate current flow in the gate drive circuit using a pair of pre-charged capacitors charged to voltages which are high relative to the switching voltage rapidly to charge and discharge the gate and overcome a complex impedance of the gate drive circuit, the capacitors having sufficiently small capacitances that a maximum sustainable gate voltage is not exceeded.

WO 2005/025065 discloses a method of pre-charging an inductor in a resonant gate driver circuit before switching the device in order to improve the switching speed.

There is, however, a need to improve very fast switching performance of power MOSFETs with a minimum of additional components.

BRIEF SUMMARY OF THE DISCLOSURE

In accordance with a first aspect of the present invention there is provided a drive circuit for a gated semiconductor switching device, the drive circuit comprising coupling between a gate drive circuit and a drain to source current supply circuit to change a gate voltage provided by the gate drive circuit dependent on a rate of change of a current in the drain to source current supply circuit, the change in gate voltage having a magnitude and phase arranged to change a switching speed of the gated semiconductor switching device, wherein the coupling between the gate drive circuit and the drain to source current supply circuit comprises a mutual inductance.

Conveniently, the gated semiconductor switching device is a MOSFET.

Conveniently, the gated semiconductor switching device comprises a gate connector conductor and a source connector conductor and the mutual inductance is between the gate connector conductor and the source connector conductor.

Alternatively, the gated semiconductor switching device comprises a gate connector conductor and a drain connector conductor and the mutual inductance is between the gate connector conductor and the drain connector conductor.

Conveniently, the mutual inductance is provided by a Rogowski coil.

Alternatively, the mutual inductance is provided by routing of a gate connector conductor and a source connector conductor or the gate connector conductor and a drain connector conductor.

Advantageously, the gate connector conductor and the source connector conductor or the gate connector conductor and drain connector conductor comprise printed circuit board tracks and the mutual inductance is provided by routing of the printed circuit board tracks.

Conveniently, the phase of the mutual inductance increases a switching speed of the gated semiconductor switching device.

Alternatively, the phase of the mutual inductance decreases a switching speed of the gated semiconductor switching device.

In accordance with a second aspect of the present invention, there is provided a method of driving a gated semiconductor switching device, comprising providing coupling between a gate drive circuit and a drain to source current supply circuit thereby changing a gate voltage provided by the gate drive circuit dependent on a rate of change of a current in the drain to source current supply circuit, the change in gate voltage having a magnitude and phase arranged to change a switching speed of the gated semiconductor switching device, wherein the coupling between the gate drive circuit and the drain to source current supply circuit comprises a mutual inductance.

Conveniently, the method comprises driving a MOSFET.

Conveniently, the gated semiconductor switching device comprises a gate connector conductor and a source connector conductor and the method comprises providing the mutual inductance between the gate connector conductor and the source connector conductor.

Alternatively, the gated semiconductor switching device comprises a gate connector conductor and a drain connector conductor and the method comprises providing the mutual inductance between the gate connector conductor and the drain connector conductor.

Conveniently the method comprises providing the mutual inductance by a Rogowski coil.

Alternatively, the method comprises providing the mutual inductance by routing of a gate connector conductor and a source connector conductor or the gate connector conductor and a drain connector conductor, respectively.

Conveniently, the gate connector conductor and the source connector conductor or the gate connector conductor and drain connector conductor comprise printed circuit board tracks and the method comprises providing the mutual inductance by routing of the respective printed circuit board tracks.

Conveniently the method comprises providing a phase connection of the mutual inductance which increases a switching speed of the gated semiconductor switching device.

Alternatively, the method comprises providing a phase connection of the mutual inductance which decreases a switching speed of the gated semiconductor switching device.

BRIEF DESCRIPTION OF THE DRAWINGS

Embodiments of the invention are further described hereinafter with reference to the accompanying drawings, in which.

DETAILED DESCRIPTION

Figure 1:
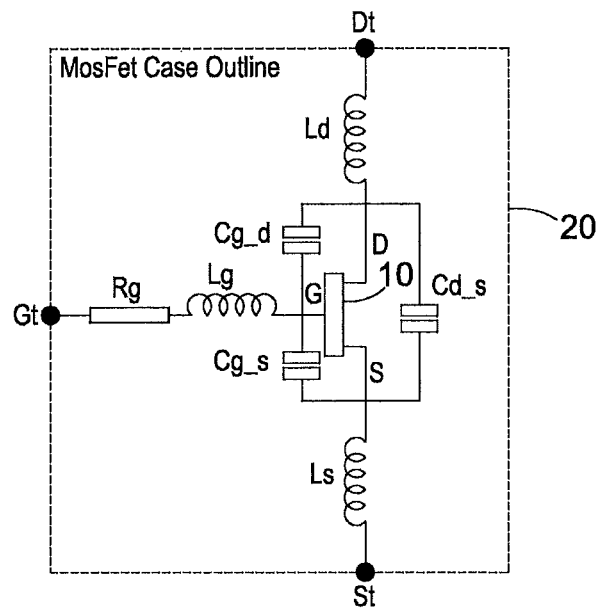
FIG. 1 is an equivalent circuit of a known packaged MOSFET.
Figure 2:
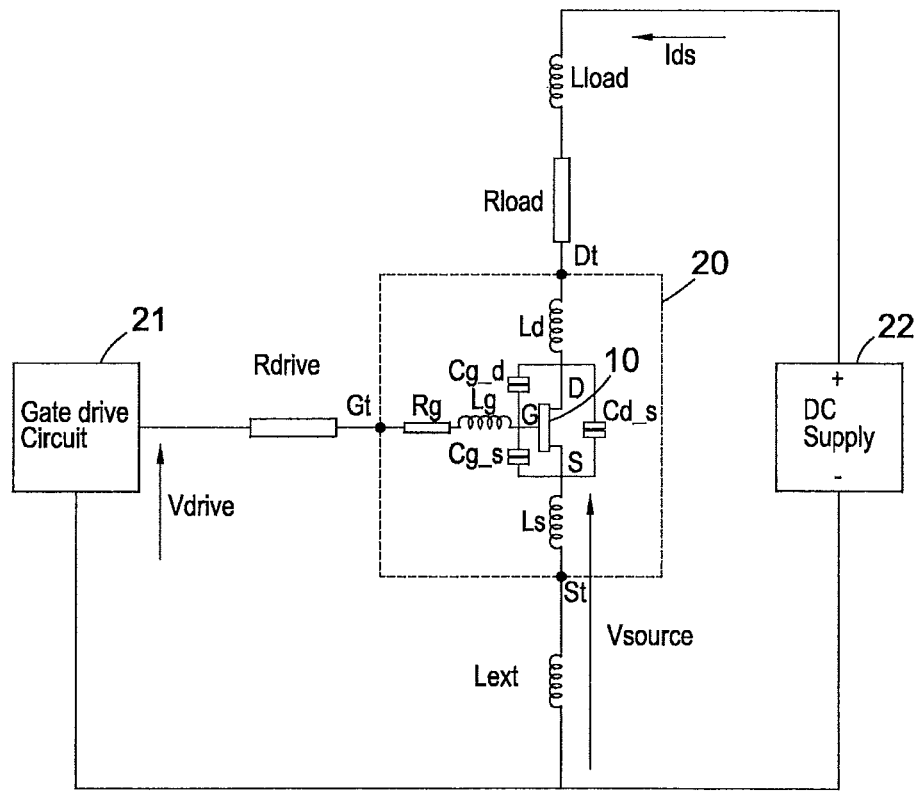
FIG. 2 is a known circuit diagram including the equivalent circuit of FIG. 1.
Figure 3:
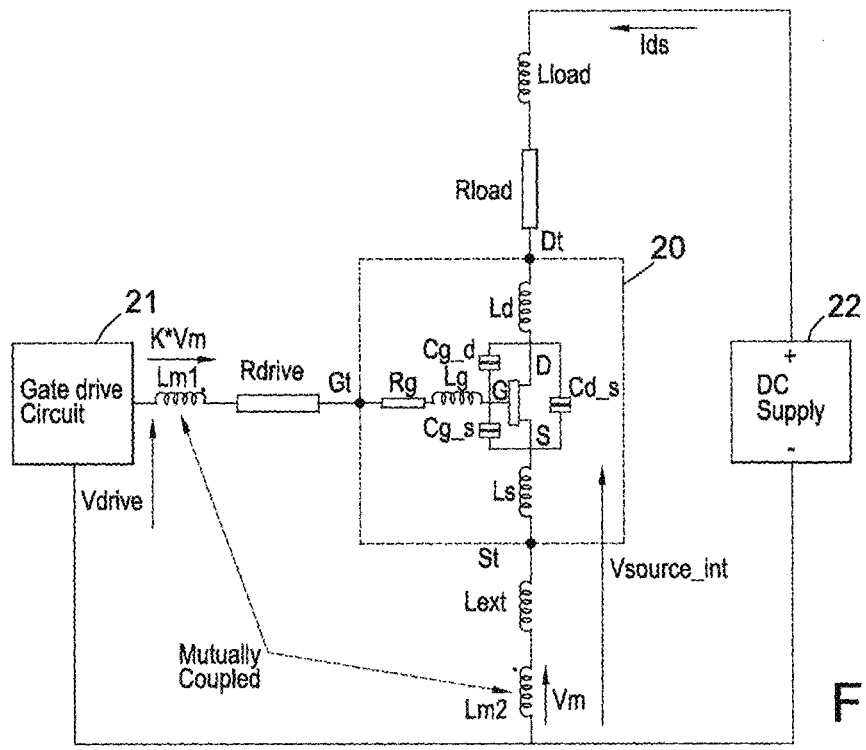
FIG. 3 is a circuit diagram including the equivalent circuit of FIG. 1 and a first embodiment of a drive circuit according to the invention.

Referring to FIG. 3, a first embodiment of a drive circuit according to the invention includes, in addition to the components in the prior art circuit of FIG. 2, a small inductance Lm2 relative to the source inductance Ls, typically within a range of 0.5 nH to 2 nH, in series with the external inductance Lext between the DC supply 22 and the external source package terminal St. The inductance Lm2 is mutually coupled to another inductance Lm1 connected in series with the drive resistance Rdrive between the external gate terminal Gt and the gate drive circuit 21. A voltage Vm across inductance Lm2 induces a voltage K*Vm across the inductance Lm1 suitably phased to add in series with the drive voltage Vdrive applied to the external gate package terminal. A value of K can be selected so that a suitably large voltage is added to the drive voltage Vdrive to compensate for the effect of a voltage Vsource_int across the source inductance Ls, the external inductance Lext and the mutually coupled inductance Lm2.

Figure 4:
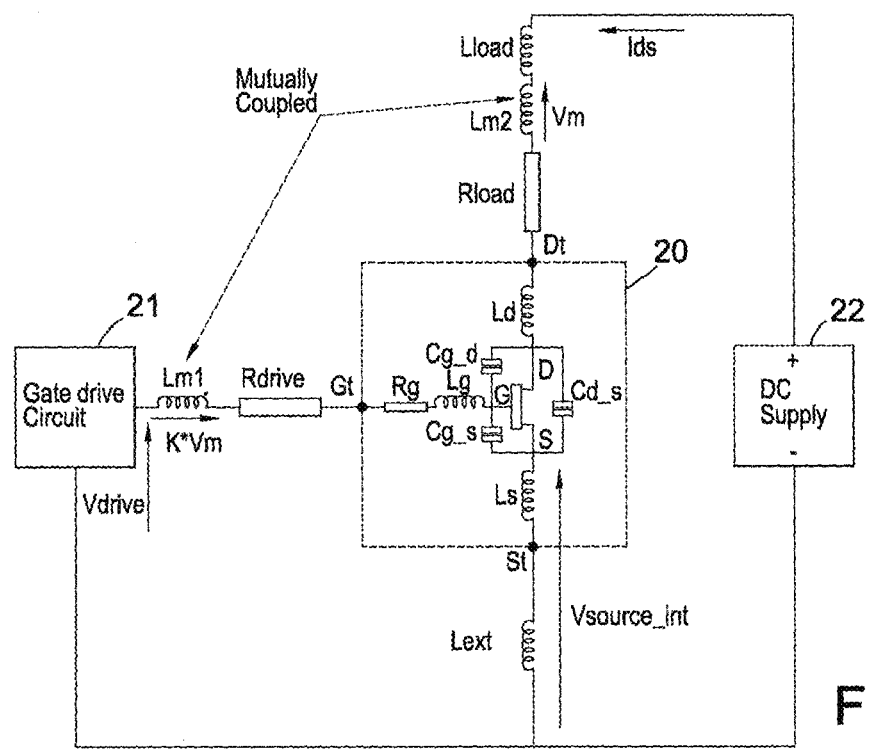
FIG. 4 is a circuit diagram including the equivalent circuit of FIG. 1 and a second embodiment of a drive circuit according to the invention.

FIG. 4 shows a circuit including a second embodiment of a drive circuit according to the invention in which the mutual inductance Lm2 is connected in series with the load Rload and Lload. This arrangement is advantageous compared with the first embodiment as it does not add to the source inductance Ls and the external inductance Lext, the very effect of which it is intended to negate.

The mutual inductance Lm1/Lm2 can be produced by using a Rogowski coil—a well known form of a mutual inductance. Most circuits of the type in question are formed using printed circuit board (PCB) techniques. For fast switching it is likely that small values, typically between 0.2 nH and 1 nH for inductances Lm1 and Lm2 will be required. Thus a suitable mutual inductance could be produced by the simple expedient of routing PCB tracks in close proximity to each other. Alternatively, appropriate routing of the gate and source leads within the MOSFET package could produce the desired Lm1 and Lm2 mutually coupled inductances.

It will be understood that the mutual inductance is always fed to or connected to the gate but only outputs a voltage signal to the gate when the current in the mutual inductance changes. This is an important aspect of the invention.

However, when switching MOSFETs very rapidly one does have to consider all the effects that control switching. It will be clear to those skilled in the art that during switching, the added voltage K*Vm applied to the gate provides positive feedback and thus the risk of circuit oscillation and instability exists. To provide mathematical verification that the system can function as intended a CAD analysis was performed using practical values with a realistic model for a commercially available MOSFET.

Figure 5:
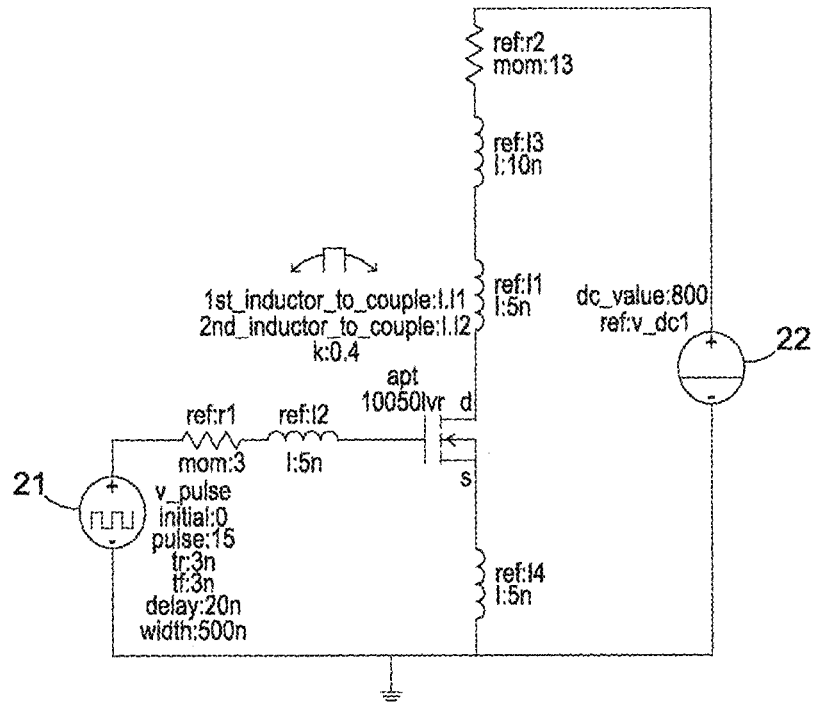
FIG. 5 is a computer simulation of the circuit of FIG. 4.

The circuit shown in FIG. 5 for the CAD analysis uses realistic practical values for the components that could be obtained in practice. The circuit was analyzed using SABER, a CAD package for detailed circuit calculations, available from Synopsys, Inc., 700 East Middlefield Road, Mountain View, Calif. 94043, USA.

Figure 6:
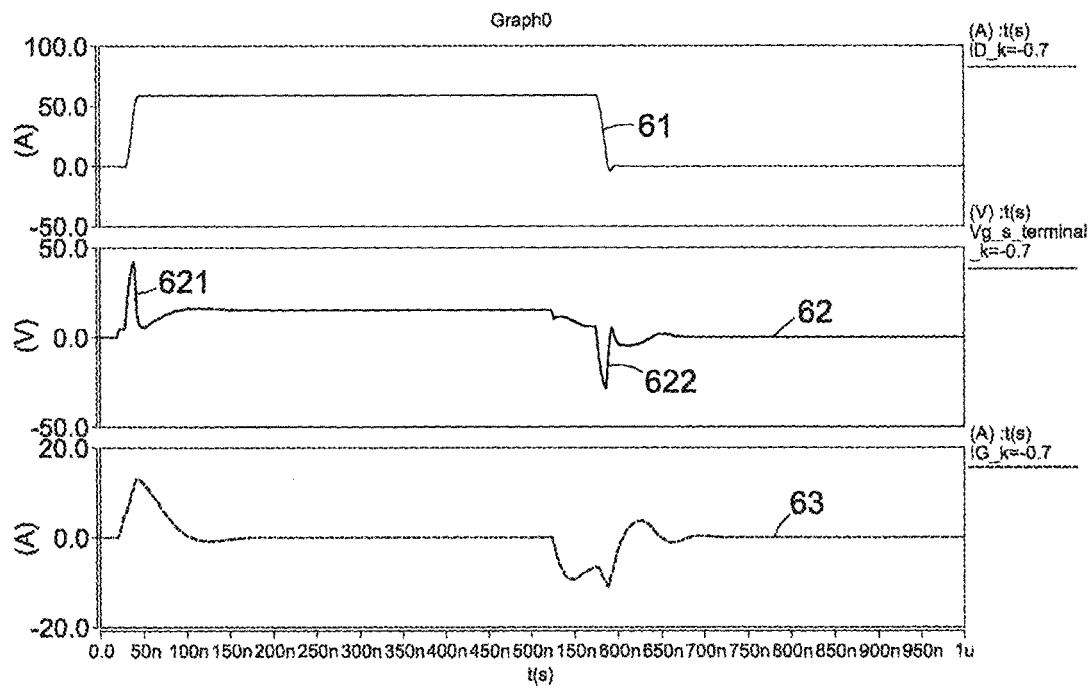
FIG. 6 comprises plots of voltages and currents obtained from the computer simulation of FIG. 5.

FIG. 6 shows results from a typical analysis indicating the performance of the circuit. The implementation is of the form of the circuit diagram of FIG. 4 with the mutual inductor in the drain circuit. The upper waveform 61 for ID_k=−0.7 is the MOSFET drain source current vs. time for a coupling coefficient of K=−0.7. The negative sign ensures that the phase of the mutual coupling is correct. The centre waveform 62 for Vg_s_terminal_K=−0.7 shows the voltage between the external gate package terminal Gt and the external source package terminal St of the MOSFET package. The high peak voltage 621 during the rise of the MOSFET drain current aids in turning on the MOSFET and at the end of the pulse the negative gate terminal voltage 622 assists in the turn off of the MOSFET. The third waveform 63 for IG_K=−0.7 shows the corresponding gate current vs. time required. Importantly the invention permits the high gate drive current required rapidly to charge the Cg_s and Cd_s capacitances to flow into the gate terminal to counteract another limitation to FET switching speed, mentioned above, of the drive source providing adequate current to charge the inherent MOSFET capacitance.

It will be noted that in the computer model, the coupling factor was shown as negative to ensure correct phasing. An interesting feature of the invention that may find additional application is that by reversing the phasing (e.g. K=+0.7) the rise time can be extended. This feature could be useful in some applications in that the facility deliberately to control the rise time could be applied to make the value longer should a particular application dictate this requirement. Importantly this feature could help limit current in an application where gross overload (the load short circuiting) was otherwise a possibility.

Figure 7:
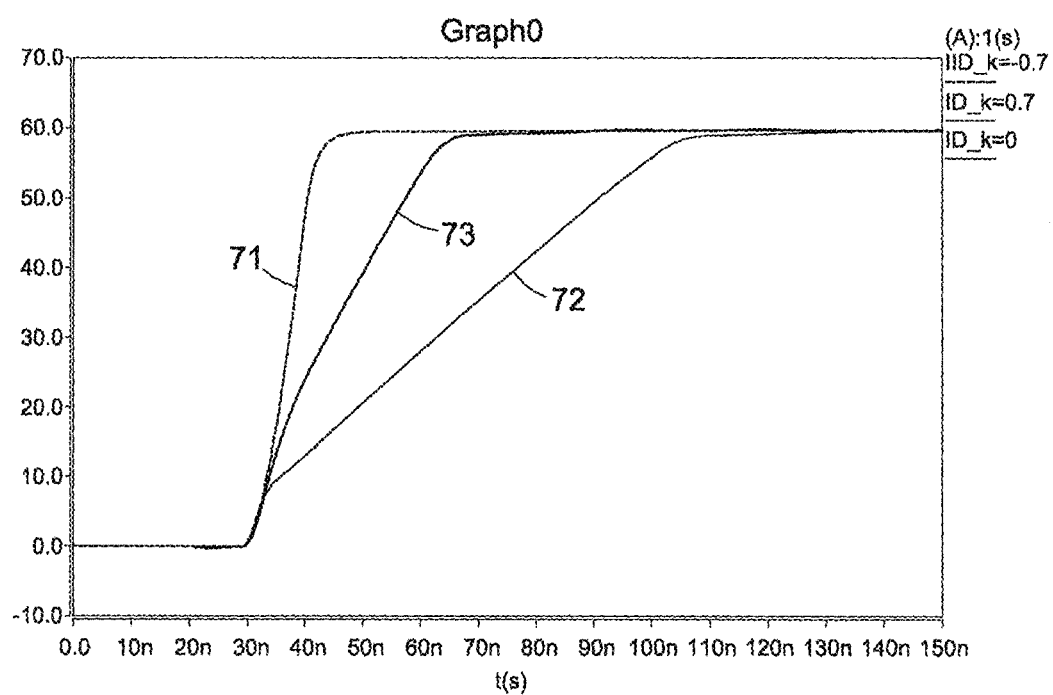
FIG. 7 shows plots of the rise time of the source to drain current for the computer simulation of FIG. 5 for different phase connections of the mutual inductance.

FIG. 7 shows rise times 71, 72, 73 of the drain-source current Ids when the MOSFET is turned on (turn on performance) for K values of −0.7, +0.7 and zero, respectively. Note that rise time 73 for K=0 represents the performance without implementation of the invention.

The invention provides the advantage of providing fast switching performance, for example 60 A in say 6 ns, or 10 A/ns, using conventional packaged devices and without recourse to expensive and complex "over-voltage" drive circuits.

It will be understood that the invention has been described for switching an N channel FET and that when applied to switching a P channel FET the applied voltages and resultant current flows are reversed with respect to those for an N channel FET.

Moreover, although the invention has been described in respect of a MOSFET, it will be understood that the invention has applicability to other gated semiconductor switching devices.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A drive circuit forming a combination with a gated semiconductor switching device, wherein:
  the gated semiconductor switching device comprises a gate, a drain and a source; and
  the drive circuit comprises a gate drive circuit to produce a drive voltage and coupled to the gate to produce a gate voltage, a drain to source current supply circuit coupled between the drain and the source; and a mutual inductance coupling between the gate drive circuit coupled to the gate and the drain to source current supply circuit to change the gate voltage, by inducing a voltage that is added in series with the drive voltage from the gate drive circuit, dependent on a rate of change of a current in the drain to source current supply circuit, the change in gate voltage having a magnitude and phase arranged to increase a switching speed of the gated semiconductor switching device.

2. The combination according to claim 1, wherein the gated semiconductor switching device is a MOSFET.

3. The combination as claimed in claim 1, wherein the gated semiconductor switching device comprises a gate connector conductor and a source connector conductor and the mutual inductance coupling is between the gate connector conductor and the source connector conductor.

4. The combination as claimed in claim 1, wherein the gated semiconductor switching device comprises a gate connector conductor and a drain connector conductor and the mutual inductance coupling is between the gate connector conductor and the drain connector conductor.

5. The combination as claimed in claim 1, wherein the mutual inductance coupling is provided by a gate connector conductor and a source connector conductor arranged in proximity to each other or the gate connector conductor and a drain connector conductor in proximity to each other.

6. The combination as claimed in claim 5, wherein the gate connector conductor and the source connector conductor or the gate connector conductor and drain connector conductor comprise printed circuit board tracks arranged in proximity to each other to produce the mutual inductance coupling.

7. The drive circuit as claimed in claim 5, wherein the conductors in proximity to each other form a Rogowski coil.

8. The drive circuit as claimed in claim 6, wherein the conductors in proximity to each other form a Rogowski coil.

9. A drive circuit as claimed in claim 1, wherein the mutual inductance coupling is arranged to provide an inductance coupled in series with a resistance between the gate drive circuit and the gate.

10. A method of driving a gated semiconductor switching device, comprising: providing mutual inductance coupling between a gate drive circuit and a drain to source current supply circuit of the gated semiconductor switching device, thereby changing a gate voltage, by inducing a voltage that is added in series with a drive voltage from the gate drive circuit, dependent on a rate of change of a current in the drain to source current supply circuit, the change in gate voltage having a magnitude and phase arranged to increase a switching speed of the gated semiconductor switching device.

11. The method as claimed in claim 10, wherein the gated semiconductor switching device comprises a MOSFET.

12. The method as claimed in claim 10, wherein the gated semiconductor switching device comprises a gate connector conductor and a source connector conductor, and the method further comprises providing the mutual inductance coupling between the gate connector conductor and the source connector conductor.

13. The method as claimed in claim 10, wherein the gated semiconductor switching device comprises a gate connector conductor and a drain connector conductor, and the method further comprises providing the mutual inductance between the gate connector conductor and the drain connector conductor.

14. The method as claimed in claim 10, wherein the gated semiconductor switching device comprises a gate connector conductor and one of a source connector conductor or a drain connector conductor, and wherein the step of providing mutual inductance coupling includes providing the mutual inductance coupling by arranging the gate connector conductor and the source connector conductor or the gate connector conductor and the drain connector conductor, respectively, in close proximity to each other.

15. The method as claimed in claim 14, wherein the gate connector conductor and the source connector conductor or the gate connector conductor and drain connector conductor comprise printed circuit board tracks, the method comprising providing the mutual inductance coupling by arranging the printed circuit board tracks in proximity to each other.

16. The drive circuit as claimed in claim 14, wherein the conductors in proximity to each other form a Rogowski coil.

17. The drive circuit as claimed in claim 15, wherein the conductors in proximity to each other form a Rogowski coil.

18. The method as claimed in claim 10, wherein the providing mutual inductance coupling includes providing an inductance coupled in series with a resistance between the gate drive circuit and the gate.

\* \* \* \* \*